(12) United States Patent
Hirabayashi et al.

(10) Patent No.: US 7,554,393 B2
(45) Date of Patent: Jun. 30, 2009

(54) SIGNAL AMPLIFIER

(75) Inventors: Atsushi Hirabayashi, Tokyo (JP); Kenji Komori, Kanagawa (JP)

(73) Assignee: Sony Corporation, Tokyo (JP)

( * ) Notice: Subject to any disclaimer, the term of this patent is extended or adjusted under 35 U.S.C. 154(b) by 157 days.

(21) Appl. No.: 11/677,258

(22) Filed: Feb. 21, 2007

(65) Prior Publication Data
US 2007/0210864 A1     Sep. 13, 2007

(30) Foreign Application Priority Data
Mar. 8, 2006    (JP)    ............................. 2006-063118

(51) Int. Cl.
*H03F 1/36*    (2006.01)
(52) U.S. Cl. ....................................................... 330/86
(58) Field of Classification Search .................. 330/86, 330/131, 134, 140, 254, 278, 279, 282
See application file for complete search history.

(56) References Cited
U.S. PATENT DOCUMENTS
4,070,632 A * 1/1978 Tuttle ........................... 330/86
4,360,787 A * 11/1982 Galpin ......................... 330/284
6,072,339 A * 6/2000 Bertolini ....................... 327/54

FOREIGN PATENT DOCUMENTS
JP           60090408 A  *  5/1985
JP           9-246897         9/1997

* cited by examiner

*Primary Examiner*—Robert Pascal
*Assistant Examiner*—Khiem D Nguyen
(74) *Attorney, Agent, or Firm*—Oblon, Spivak, McClelland, Maier & Neustadt, P.C.

(57) ABSTRACT

A signal amplifier includes a discrete-variable-gain amplifying unit, a gain of which takes a discrete value and changes stepwise, a linear-variable-gain amplifying unit connected in series to the discrete-variable-gain amplifying unit, a gain of which changes continuously, control-signal outputting means for detecting a level of an output signal from a series connection circuit of the discrete-variable-gain amplifying unit and the linear-variable-gain amplifying unit and outputting a control signal corresponding to a difference between the level of the output signal and a reference voltage set as a comparative level to control the gain of the linear-variable-gain amplifying unit, and gain-switching control means for controlling to switch the gain of the discrete-variable-gain amplifying unit when the control signal deviates from a setting range for the control signal that is set according to a variable gain range of the discrete-variable-gain amplifying unit.

8 Claims, 9 Drawing Sheets

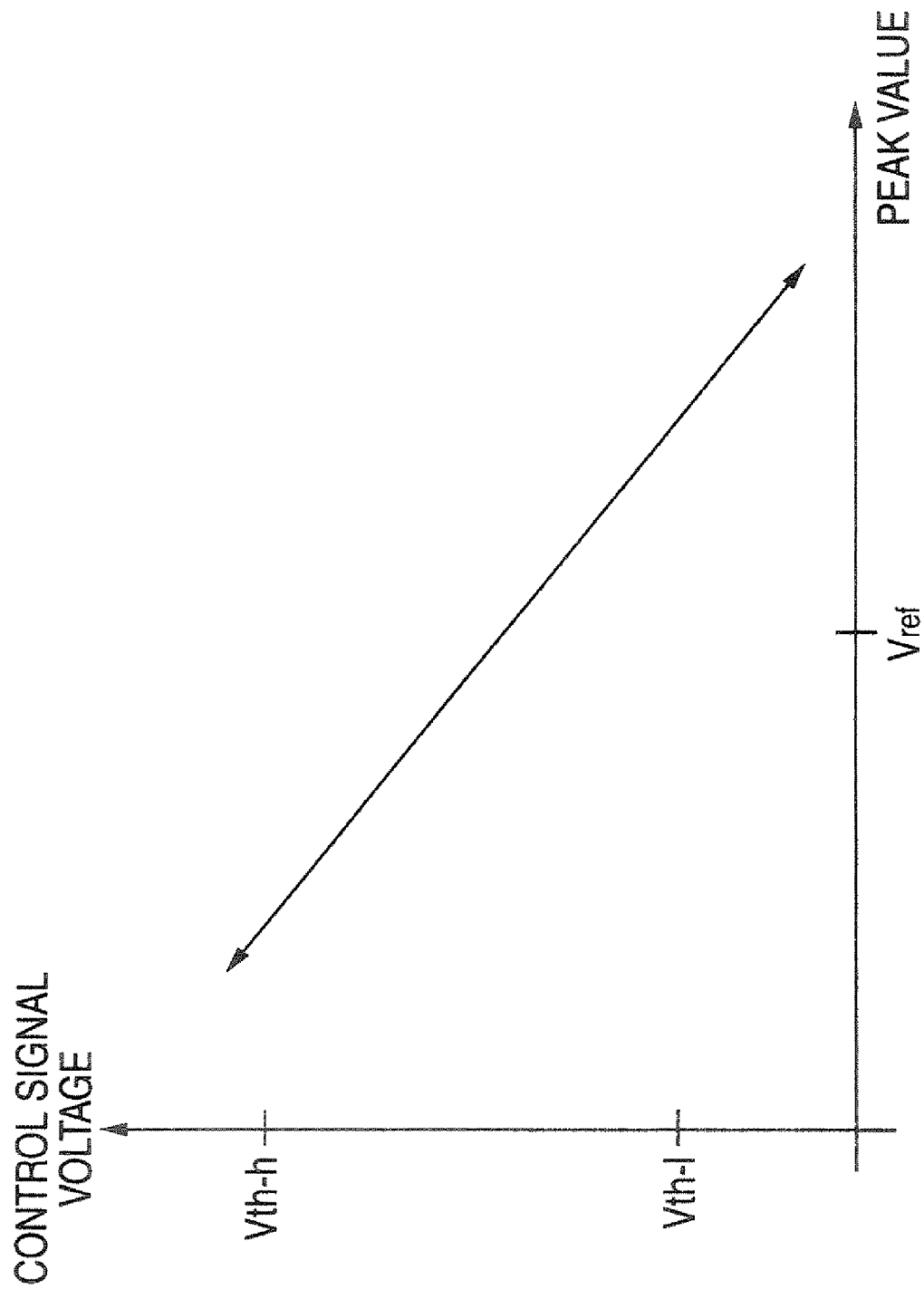

SIGNAL AMPLIFIER

CROSS-REFERENCES TO RELATED APPLICATIONS

The present invention contains subject matter related to Japanese Patent Application JP 2006-063118 filed in the Japanese Patent Office on Mar. 8, 2006, the entire contents of which being incorporated herein by reference.

BACKGROUND OF THE INVENTION

1. Field of the Invention

The present invention relates to a signal amplifier used in an automatic gain control amplifier having a wide gain variable width.

2. Description of the Related Art

An automatic gain control amplifier that keeps an output signal level constant with respect to a change in an input signal level is used for various applications. When a circuit of such an automatic gain control amplifier is formed in an IC (integrated circuit), as a method of forming a variable gain amplifier circuit, the following two methods are conceivable.

A first method is a method of converting an input signal into a signal current and amplifying the signal current. A second method is a method of changing a load resistance for determining an amplification degree of an output signal to change an output level. The first method is often applied to analog circuits. Since again is changed stepwise in the second method, the second method is often used in circuits in which MOS transistors are used.

It is possible to relatively easily realize the first method using a bipolar junction transistor (BJT). An example of a basic structure of the bipolar junction transistor is shown in FIG. 8. In FIG. 8, emitters of NPN-type transistors 101 and 102 are connected in common to a current source 103. A control signal voltage Vc is applied between bases of the transistors 101 and 102. When electric currents supplied to collectors of the transistors 101 and 102 are $I_1$ and $I_2$, respectively, and an electric current flowing through the current source 103 is $2 \cdot I_0$, the following relation is established between the currents $I_1$, $I_2$, and $I_0$ and the control signal voltage Vc.

$$I_1 + I_2 = 2 \cdot I_0 \quad \text{Equation 1}$$
$$V_C = \frac{kT}{q} \ln\left(\frac{I_1}{I_2}\right)$$
$$\therefore I_1 = \frac{\exp\left(\frac{q \cdot V_C}{kT}\right)}{1 + \exp\left(\frac{q \cdot V_C}{kT}\right)} \cdot 2 \cdot I_0$$

As it is evident from this equation, values of the currents $I_1$ and $I_2$ change by a great degree according to the control signal voltage Vc.

In the second method, a normal MOS transistor is used as a switch element. A load resistance used in a voltage-current converting unit on an input side of an amplifier or a current-voltage converting unit on an output side of the amplifier is changed stepwise. A gain changes discretely (digitally or stepwise) rather than changing linearly (analogically).

FIGS. 9A and 9B are diagrams for explaining an example of a variable gain amplifier circuit according to the second method. FIG. 9A is a circuit diagram showing an example of a basic structure of the variable gain amplifier circuit. An input terminal 111, to which an input signal voltage Vin is supplied, is connected to an inverting input terminal (−terminal) of an operational amplifier 113 via a resistor 112 serving as a voltage-current converting unit on an input side. A non-inverting input terminal (+terminal) of the operational amplifier 113 is connected to a reference potential, for example, a ground potential. A load resistor circuit 120 serving as a current-voltage converting unit on an output side is connected between the inverting input terminal (−terminal) and an output terminal 114 of the operational amplifier 113. A value (a load resistance Rd) of the load resistor circuit 120 changes stepwise (discretely or digitally). In the load resistor circuit 120, a serial connection circuit of a resistor 121a and a switch 122a, a serial connection circuit of a resistor 121b and a switch 122b, . . . , a serial connection circuit of a resistor 121n and a switch 122n are connected in parallel to one another. The switches 122a, 122b, . . . , 122n of the load resistor circuit 120 are subjected to changeover control according to a changeover control signal (Control-Bit) from the terminal 123 and a resistance of the load resistor circuit 120 changes stepwise. Consequently, as shown in FIG. 9B, a gain changes stepwise (discretely or digitally).

An example of the first method is disclosed in JP-A-9-246897 and an example of the second method is disclosed in JP-A-2003-273674.

SUMMARY OF THE INVENTION

In the case of the first method, an operation for converting an input signal into a signal current and reducing the signal current itself is often performed at an initial stage Thus, an SN ratio in a region for reducing a gain is considerably deteriorated. An operation state of a transistor used in changing a gain is different by a great degree at the time when the gain is reduced and at the time when the gain is amplified. Thus, when it is attempted to obtain a large gain variable width (in a wide area), distortion occurs.

In the case of the second method, a gain fluctuates in a gain fluctuation range of a variable minimum width (step) in which the automatic gain control is performed stepwise. An extremely large number of steps are necessary to cause a gain change as smoothly (continuously) as possible. In other words, in the second embodiment, continuity of the gain change is lost because a gain changes discretely. To prevent the loss of the continuity of the gain change, the number of switching steps has to be set infinitely large.

Therefore, it is desirable to provide a signal amplifier that can obtain a continuous gain change while securing a wide gain variable range.

According to an embodiment of the invention, there is provided a signal amplifier including a discrete-variable-gain amplifying unit, a gain of which takes a discrete value and changes stepwise, a linear-variable-gain amplifying unit connected in series to the discrete-variable-gain amplifying unit, a gain of which changes continuously, control-signal outputting means for detecting a level of an output signal from a series connection circuit of the discrete-variable-gain amplifying unit and the linear-variable-gain amplifying unit and outputting a control signal corresponding to a difference between the level of the output signal and a reference voltage set as a comparative level to control the gain of the linear-variable-gain amplifying unit, and gain-switching control means for controlling to switch the gain of the discrete-variable-gain amplifying unit when the control signal deviates from a setting range for the control signal that is set according to a variable gain range of the discrete-variable-gain amplifying unit.

It is preferable that the discrete-variable-gain amplifying unit includes a first operational amplifier that converts an input signal voltage into an electric current and a second operational amplifier that converts the electric current from the first operational amplifier into a voltage and has a load resistor unit, a resistance of which changes stepwise. It is preferable that the control-signal outputting means outputs a control signal for performing control for reducing the gain of the linear-variable-gain amplifying unit when a peak value of an output signal from the series connection circuit is higher than the reference voltage and increasing the gain of the linear-variable-gain amplifying unit when a peak value of an output signal of the series connection circuit is lower than the reference voltage. It is preferable that the gain-switching control means controls to switch the gain of the discrete-variable-gain amplifying unit to increase by one step when a control signal voltage is larger than a first threshold Vth-h, controls to switch the gain of the discrete-variable-gain amplifying unit to decrease by one step when the control signal voltage is smaller than a second threshold Vth-l , and stops gain switching for the discrete-variable-gain amplifying unit when the control signal voltage is between the first threshold Vth-h and the second threshold Vth-l.

According to the embodiment of the invention, it is possible to prevent a marked change in a bias state of an operation element while giving a wide dynamic range to a variable gain and a characteristic by merging the linear-variable-gain amplifying unit that changes a gain linearly and the discrete-variable-gain amplifying unit that changes a gain stepwise.

BRIEF DESCRIPTION OF THE DRAWINGS

FIG. 3 is a diagram showing a control signal voltage with respect to a peak value of an output signal;

DESCRIPTION OF THE PREFERRED EMBODIMENTS

Embodiments of the invention will be hereinafter explained in detail with reference to the accompanying drawings.

First Embodiment

Figure 1:
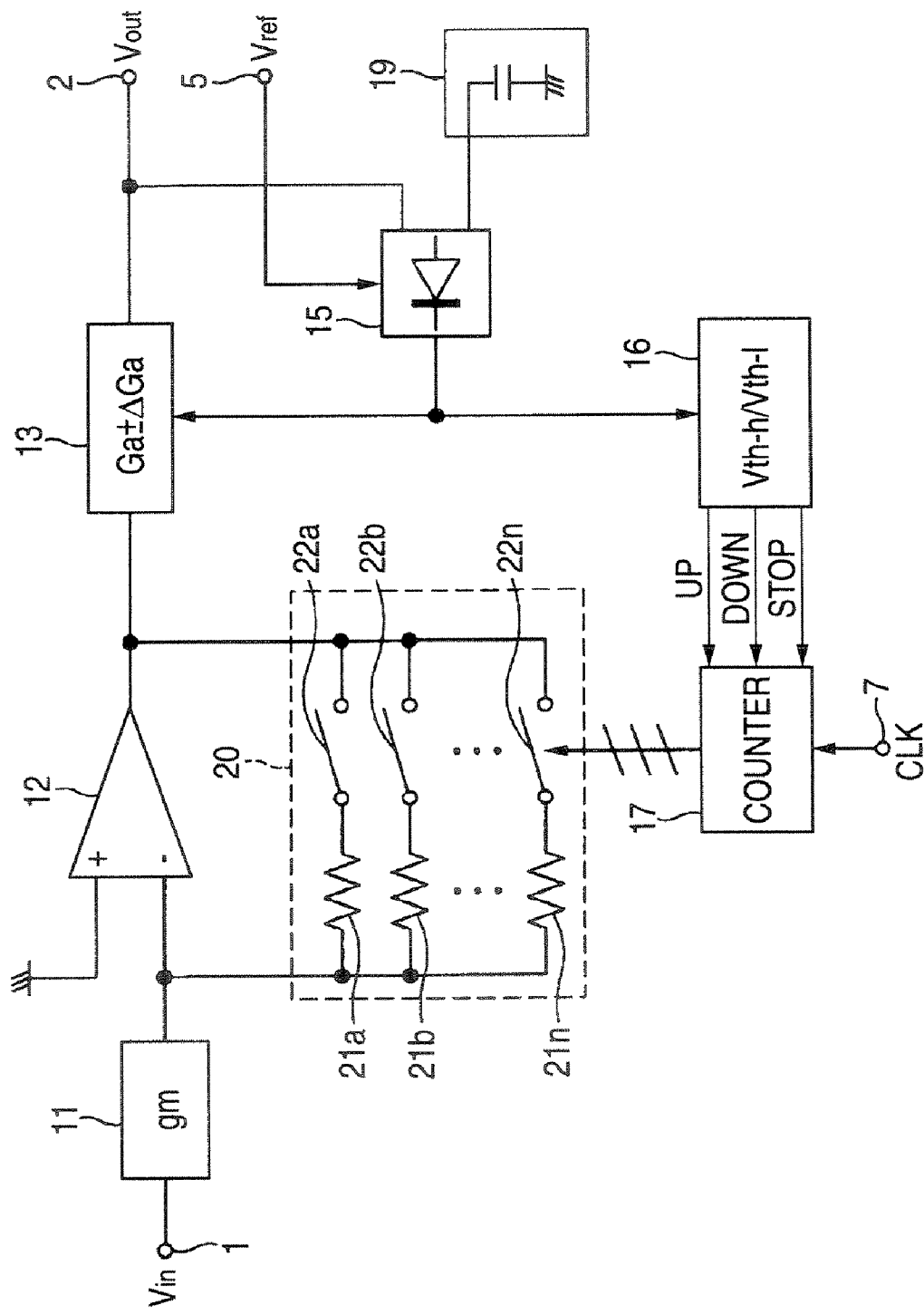
FIG. 1 is a circuit diagram showing an example of a structure of a signal amplifier according to a first embodiment of the invention.

FIG. 1 is a circuit diagram showing an example of a structure of a signal amplifier according to a first embodiment of the invention. In FIG. 1, an input signal (Vin) from an input terminal 1 is sent to an inverting input terminal (−terminal) of a second operational amplifier 12 via a first operational amplifier 11 having voltage-current conversion ability of gm [A/V]. A noninverting input terminal (+terminal) of the second operational amplifier 12 is connected to a reference potential, for example, a ground potential. A load resistor circuit 20 equivalent to a current-voltage converting unit is connected between the inverting input terminal (−terminal) and an output terminal of the second operational amplifier 12. A value (a load resistance Rd) of the load resistor circuit 20 changes stepwise (discretely or digitally). In the load resistor circuit 20, a series connection circuit of a resistor 21a and a switch 22a, a series connection circuit of a resistor 21b and a switch 22b, . . . , a series connection circuit of a resistor 21n and a switch 22n are connected in parallel to one another. An output signal from the second operational amplifier 12 is sent to a third operational amplifier 13 that is capable of linearly controlling a gain. An output signal (Vout) is extracted from the third operational amplifier 13 via an output terminal 2.

When the output signal (Vout) from the output terminal 2 is sent to a level detector 15, a control signal corresponding to an output level (a peak value of the output signal) is extracted and sent to a gain control terminal of the third operational amplifier 13 and also sent to a control-signal-voltage discriminator 16. A signal for counting up (up) and counting down (down) an up/down counter 17 and a stop signal for stopping a count operation are outputted from the control-signal-voltage discriminator 16. The signals are sent to the up/down counter 17. An output from the up/down counter 17 is sent to the load resistor circuit 20 of the second operational amplifier 12. The load resistance Rd of the load resistor circuit 20 is controlled to be switched stepwise according to the output from the up/down counter 17. A gain of the second operational amplifier 12 is also controlled to be switched stepwise (discretely or digitally) according to a change in the load resistance Rd. A gain of the third operational amplifier 13 is subjected to variable control linearly (analogically). When a variable width of the gain is ±ΔGa (dB) and a fixed amplification degree is Ga (dB), a total gain is {(Ga±ΔGa) (dB).

In the signal amplifier in FIG. 1, the first operational amplifier 11 and the second operational amplifier 12 constitute a discrete-variable-gain amplifying unit, a gain of which takes a discrete value and changes stepwise. The third operational amplifier 13 serving as a linear-variable-gain amplifying unit, a gain of which changes continuously, is connected in series to the discrete-variable-gain amplifying unit. The level detector 15 serving as control-signal outputting means is provided. The level detector 15 detects a level of an output signal from the third operational amplifier 13 and outputs a control signal corresponding to a difference between the level of the output signal and a reference voltage Vref set as a comparative level to control a gain of the linear-variable-gain amplifier. The control-signal-voltage discriminator 16 and the up/down counter 17 serving gain-switching control means are provided. The control-signal-voltage discriminator 16 and the up/down counter 17 control to switch a gain of the discrete-variable-gain amplifying unit when a control signal deviates from a setting range for the control signal that is set according to a variable gain range of the discrete-variable-gain amplifying unit. The level detector 15 serving as the control-signal outputting means outputs a control signal for performing control for reducing the gain of the third operational amplifier 13 serving as the linear-variable-gain amplifying unit when a peak value of an output signal from the third operational amplifier 13 is higher than the reference voltage Vref and increasing the gain of the third operational amplifier 13 when the peak value of the output signal from the third operational amplifier 13 is lower than the reference voltage Vref.

In the signal amplifier circuit shown in FIG. 1, an output (an output signal voltage) Vout with respect to an input (an input signal voltage) Vin is represented by the following equation.

$$Vout = Vin \cdot gm \cdot Rd \cdot 10^{((Ga \pm \Delta Ga)/20)} \quad \text{Equation 2}$$

Figures 2A, 2B:
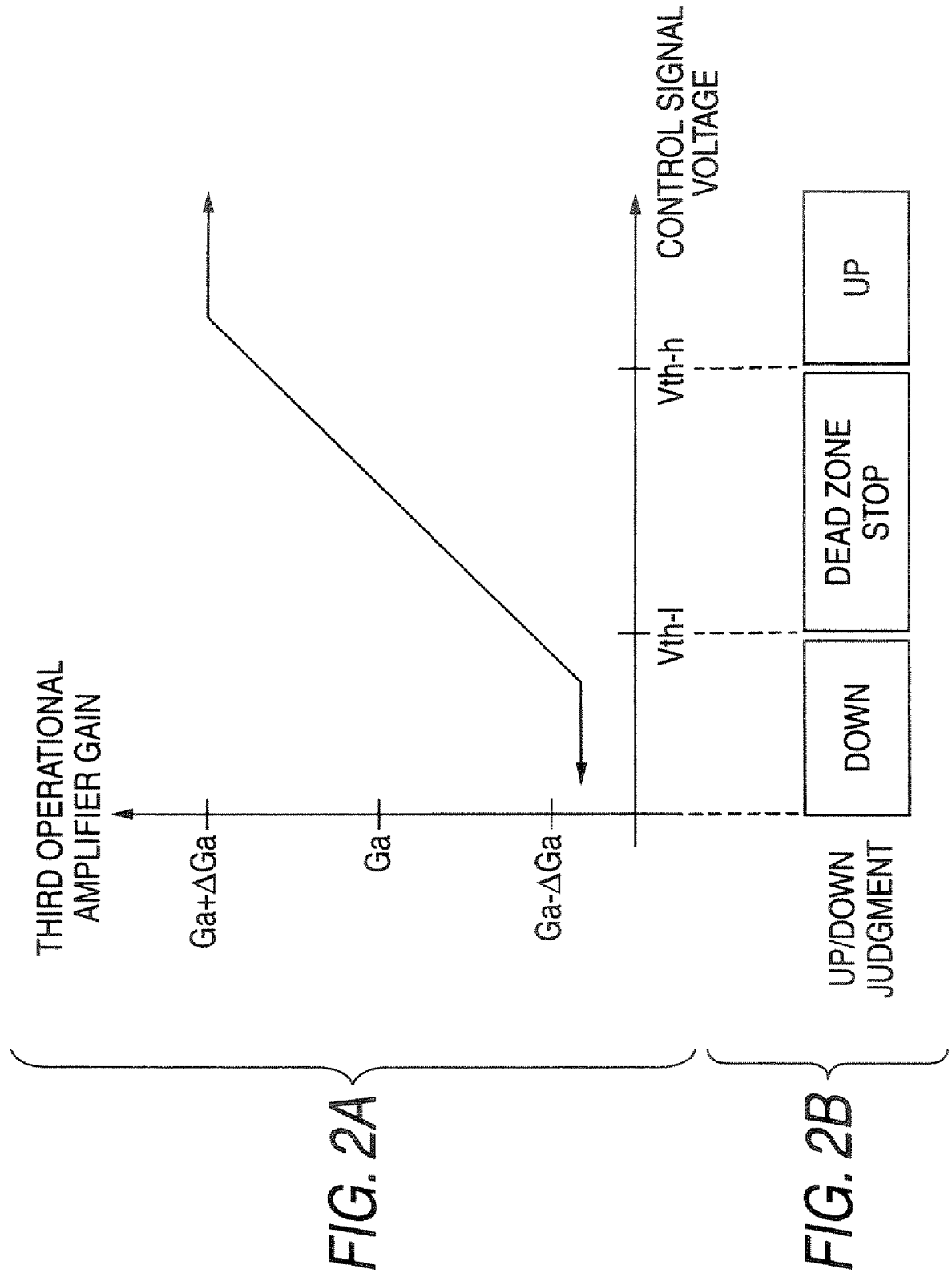
FIG. 2 is a diagram showing (A) a gain fluctuation in a third operational amplifier 13 and (B) an output from a control-signal-voltage discriminator 16 with respect to a control signal voltage from a level detector 15.

The output Vout represented by Equation 2 is directly sent to the level detector 15 and an amplitude (a peak value) of the output Vout is checked. The level detector 15 detects a peak value of an output signal and, at the same time, obtains the peak value as a DC potential. A reference potential (a target voltage or a comparative voltage) Vref to be compared with the peak value of the output signal is supplied to the level detector 15 via a terminal 5. The level detector 15 discriminates a level of the peak value (the DC potential) of the output signal with respect to the reference voltage Vref and outputs a control signal corresponding to a difference between the peak value and the reference potential Vref. A gain fluctuation in the third operational amplifier 13 with respect to the control signal from the level detector 15 and a discrimination output of the control-signal-voltage discriminator 16 are shown in FIGS. 2A and 2B, respectively. The control signal voltage outputted by the level detector 15 with respect to the peak value of the output signal is shown in FIG. 3. A time constant circuit 19 is connected to the level detector 15. The control signal voltage changes with a time constant T1 with respect to a change in the peak value of the output signal. The control signal from the level detector 15 is sent to the third operational amplifier 13 and the control-signal-voltage discriminator 16. A gain of the third operational amplifier 13 is subjected to variable control linearly (analogically) according to this control signal as described above.

As shown in FIG. 2B, the control-signal-voltage discriminator 16 identifies (discriminates or differentiates) a voltage of the control signal from the level detector 15 using first and second thresholds Vth-h and Vth-l (Vth-h>Vth-l), converts the voltage into an up/down signal for counting up or down the up/down counter 17 and a stop signal for bringing a count operation into a stop state, and outputs the signals. Specifically, the control-signal-voltage discriminator 16 outputs the up signal when the voltage of the control signal is higher than the first threshold Vth-h, outputs the stop signal when the voltage of the control signal is between the first threshold Vth-h and the second threshold Vth-l, and outputs the down signal when the voltage of the control signal is lower than the second threshold Vth-l. The count operation of the up/down counter 17 is controlled according to an output signal from the control-signal-voltage discriminator 16. A gain of the second operational amplifier 12 is controlled to be switched stepwise according to an output from the up/down counter 17.

In other words, when a high control signal voltage exceeding the threshold Vth-h is supplied from the level detector 15, the up signal is outputted from the control-signal-voltage discriminator 16 to increase the gain of the second operational amplifier 12 by one step. When a control signal voltage lower than the threshold value Vth-l is supplied from the level detector 15, the down signal is outputted from the control-signal-voltage discriminator 16 to reduce the gain of the second operational amplifier 12 by one step. When a control signal voltage is between the thresholds Vth-h and Vth-l, the control signal voltage is in a dead zone. Neither the up signal nor the down signal is outputted and the stop signal for stopping the counter is outputted.

A clock signal CLK for determining speed of the count operation is supplied to the up/down counter 17 via a clock input terminal 7. A period T2 of the clock signal CLK is set substantially large compared with a time constant T1 at the time when a control signal is outputted from the level detector 15 (T1<<T2).

Figure 4:
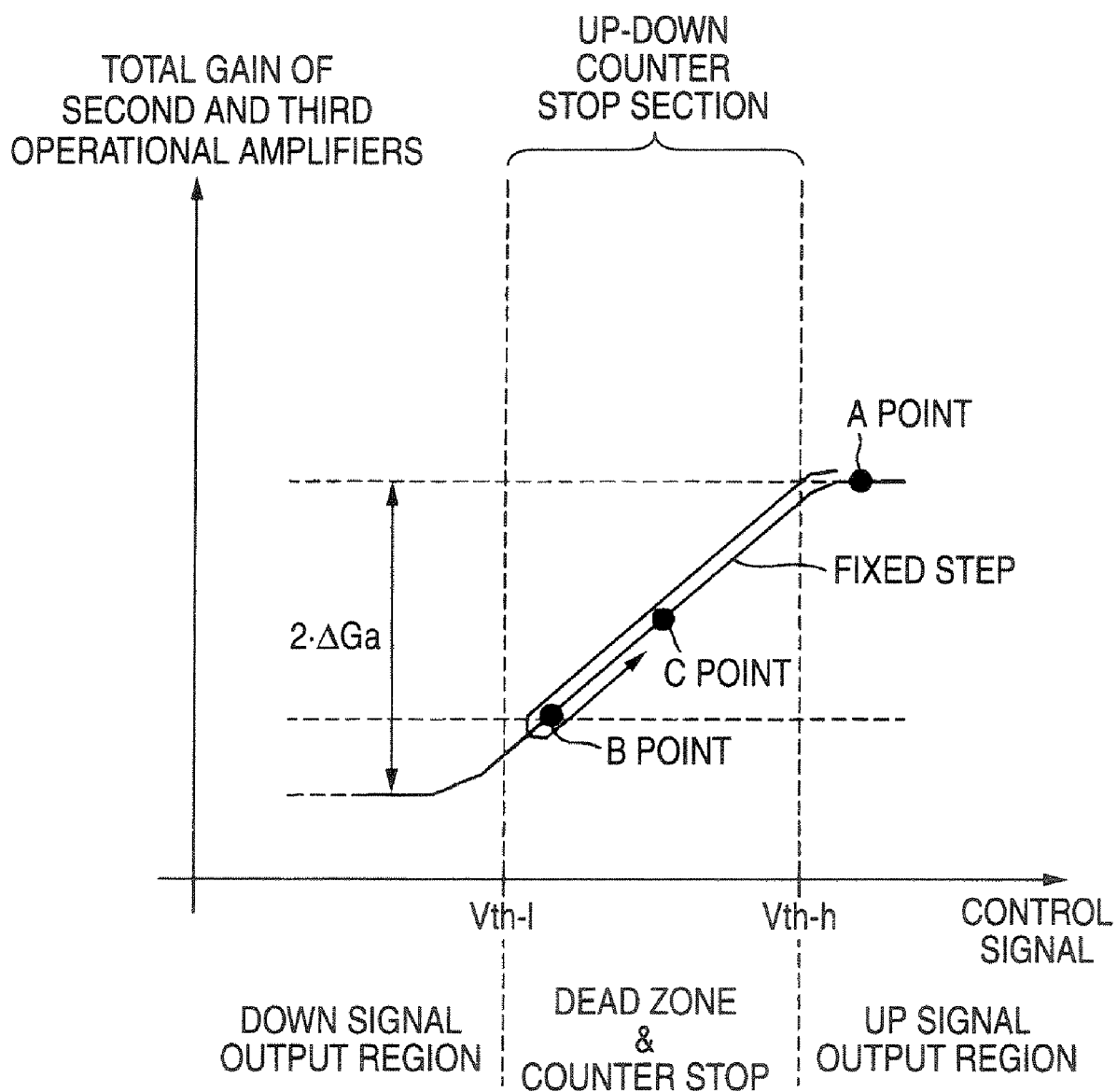
FIG. 4 is a diagram for explaining an operation at the time when a gain of a second operational amplifier is fixed.

A gain control operation at the time when the second operational amplifier 12 is controlled within a fixed gain will be explained with reference to FIG. 4. FIG. 4 shows a state in which the second operational amplifier 12 is at a step of a fixed gain. A point when the gain control operation is completed and the second operational amplifier 12 comes into a steady state is a C point. In this case, when a control signal voltage is at an A point by chance, this indicates that the entire amplifier has a gain larger than intended. In this state, since an output level (a peak value of an output signal) is higher than the reference voltage Vref, according to FIG. 3, the level detector 15 attempts to change the voltage of the control signal to a low value with the time constant T1. Therefore, a voltage at the A point in FIG. 4 starts to fall and shifts in a direction of the C point. Speed in this case depends on a time constant of the time constant circuit 19. When the control signal voltage shifting to the C point reaches a B point beyond the C point, this means that the entire amplifier has a gain smaller than intended. This state is equivalent to a state in which a peal value of an output signal is lower than the reference voltage Vref. Therefore, the level detector 15 attempts to change the control signal voltage to a high value as shown in FIG. 3. Therefore, the voltage at the B point in FIG. 4 starts to move up and shifts to the C point. The operation described above is repeated and continued until a peal value of the control signal voltage finally settles at the reference voltage Vref. The operation is stabilized and the control signal voltage finally settles at the C point. The time constant T1 for slowly changing a gain change operation of the third operational amplifier 13 in this case is determined by the time constant circuit 19 in FIG. 1. In most cases, the time constant circuit 19 is an LPF (low-pass filter) of an integrator type that uses a capacitor. A value of the time constant is determined according to actual use. This is because response speed of gain control depends on a setting of the time constant.

An operation at the time when the second operational amplifier 12 performs gain control while changing to switch a gain thereof stepwise will be explained with reference to FIG. 5.

As indicated by Equation 2 above, a gain of the third operational amplifier 13 changes in the range of {Ga±ΔGa} dB. It is assumed that a control signal voltage is at a P point in an initial state and a final steady state is a K point. As a number of a step of a gain of the second operational amplifier 12 to be discretely switched, the initial state is set as "j" i.e., the gain of the second operational amplifier 12 is at a jth step (step j). This means that a gain of the second operational amplifier 12 at the P point in FIG. 5 is at the jth step (step j). The K point is equivalent to a state in which a gain of the second operational amplifier 12 is at a j-1th step (step j-1).

When the control signal voltage is at the P point, this means that the peak value of the output signal is higher than the reference voltage Vref. Therefore, the level detector 15 attempts to reduce a gain of the third operational amplifier 13 to {Ga−ΔGa} dB, which is a state of a smallest gain, and continues to output a control signal to reduce the gain of the operational amplifier with the time constant T1 as much as possible. At the same time, since the control signal voltage exceeds the threshold Vth-h, the up signal for controlling to switch the second operational amplifier 12 to a step of a higher gain is outputted from the control-signal-voltage discriminator 16 and supplied to the up/down counter 17.

In response to the up signal, the up/down counter 17 performs a count operation at the period T2 of the clock signal CLK supplied via the clock input terminal 7. The up signal is neglected until timing when the next clock signal CLK is inputted. Since the period T2 is sufficiently larger than the time constant T1 of the control signal from the level detector 15 (T1<<T2), the third operational amplifier 13, again of which is controlled with the time constant T1, attempts to reduce the gain to {Ga−ΔGa} dB, which is the state of a smallest gain, in accordance with a curve in FIG. 3. As a result, the control signal voltage shifts from the P point in FIG. 5 to a Q point.

When the control signal voltage shifts to the Q point, since a gain of the entire amplifier is larger than that at the K point, which is a desired final point, the peak value of the output signal is larger than the reference voltage Vref. Therefore, the third operational amplifier 13 continues to output a control signal to further reduce the gain. However, since the gain is not reduced unless the second operational amplifier 12 changes a step according to an output from the up/down counter 17, as a result, the control signal voltage stays at the Q point. At the same time, as shown in FIG. 2B, the control signal discriminator 16 continues to output the down signal. When time during which the control signal discriminator 16 outputs the down signal exceeds the period T2, the clock signal CLK is inputted to the terminal 7 of the up/down counter 17. The up/down counter 17 performs a count operation according to the clock signal CLK and controls to switch the step (in this case, the jth step (step j)) of the gain of the second operational amplifier 12 to be lower by one step. This switching operation is an instantaneous operation for simple on/off of the switches 22a, 22b, . . . , 22n of the load resistor circuit 20. Therefore, the control signal voltage transitions to a state of a gain at the j-1 step (step j-1) (an R point in FIG. 5) while keeping a potential thereof.

At the R point where the gain of the second operational amplifier 12 transitions to the j-1 step (step j-1), a gain of the entire amplifier is small compared with that at the K point, which is the desired final point. Thus, the peak value of the output signal is lower than the reference voltage Vref. The control signal attempts to raise the gain to {Ga+ΔGa} dB, which is a state of a largest gain. This operation is performed with the time constant T1. In other words, the control signal voltage rises before the next clock signal CLK is inputted and, first, exceeds the threshold Vth-l. At this point, since the control signal voltage enters the dead zone in FIG. 2B, the operation of the up/down counter 17 is stopped and the gain of the second operational amplifier 12 is not switched. The control signal voltage slowly rises with the time constant T1 and passes the K point. When the control signal voltage passes the K point, it is recognized that the peak value of the output signal exceeds the reference voltage Vref and a gain of the third operational amplifier 13 is reduced. The control signal voltage, which has passed the K point, starts to fall and shifts to the K point. When the control signal voltage passes the K point again and a gain of the entire amplifier is lower than the desired gain, the control signal acts to raise the gain. While the operation described is repeated, the control signal voltage finally settles at the K point at step j-1. As described above, the signal amplifier according to this embodiment is constituted by merging the two kinds of gain change circuits, namely, the linear-variable-gain amplifying unit (the third operational amplifier 13) that linearly controls an output level to a certain level and the discrete-variable-gain amplifying unit (the first and the second operational amplifiers 11 and 12), a gain of which changes stepwise (discretely). The automatic gain control circuit can obtain a target gain according to a merged operation of the linear-variable-gain amplifying unit and the discrete-variable-gain amplifying unit.

Figure 5:
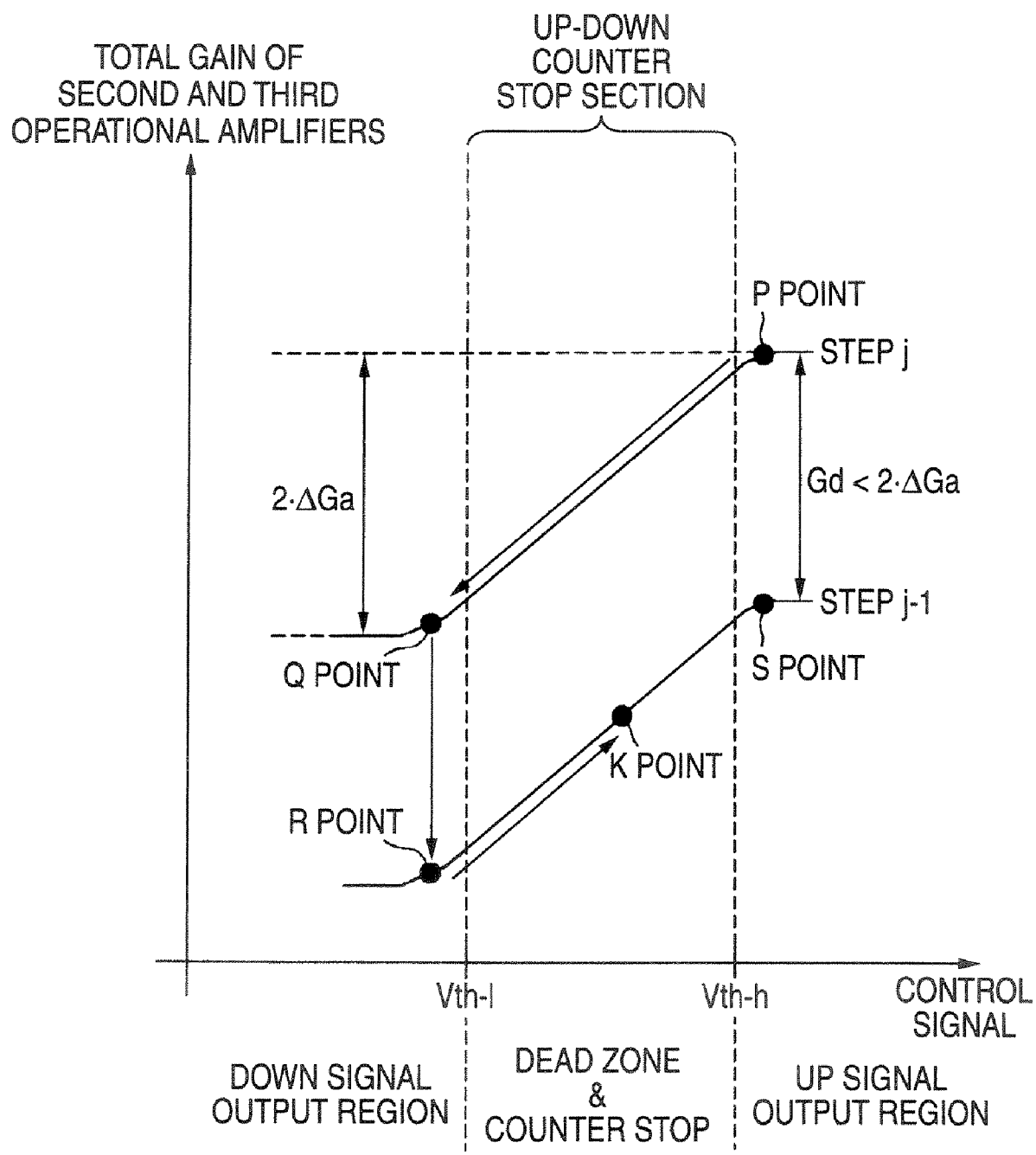
FIG. 5 is a diagram for explaining an operation at the time when a gain of the second operational amplifier is switched.

As it is seen from FIGS. 4 and 5, a linear gain variable width is fixed. A range of a signal voltage for controlling the linear gain variable width is also fixed. This means that a bias state of an element constituting the linear gain change circuit does not change by a great degree. This is extremely effective in that it is possible to control distortion.

In FIG. 5, the stepwise changes (step changes) of the discrete-variable-gain amplifying unit (the first and the second operational amplifiers 11 and 12), a gain of which changes stepwise, are smoothly connected by a gain control curve of the linear-variable-gain amplifying unit (the third operational amplifier 13) having a linear variable gain. It is conceivable that, in a control curve same as that in FIG. 5, as shown in FIG. 6, an interval (Gd) between the jth step (step j) and the j-1th step (step j-1) is larger than 2·ΔGa of the linear variable gain range.

Figure 6:
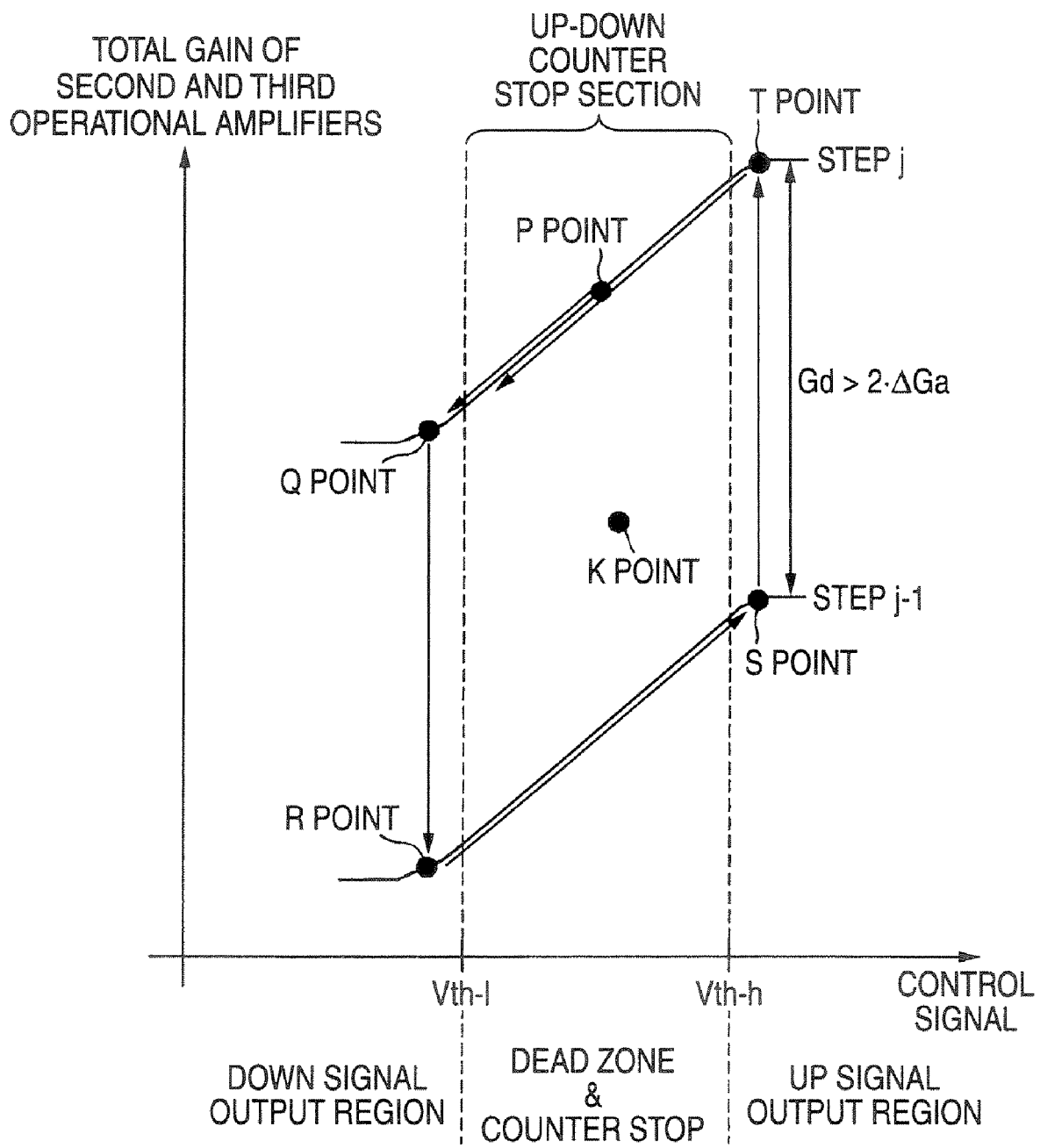
FIG. 6 is a diagram for explaining an operation of another example at the time when a gain of the second operational amplifier is switched.

In FIG. 6, it is assumed that, when a K point is a final control signal voltage point, a first control signal voltage point is a P point. A gain is too large at the P point. Since a control signal voltage does not exceed the threshold Vth-h at the P point, the control signal voltage falls. The potential continues to fall and exceeds (falls below) the threshold Vth-l This point is a Q point. Since the control signal voltage is lower than the threshold Vth-l at the Q point, the up/down counter 17 operates when the clock signal CLK with the period T2 is inputted and controls to switch a resistance of the load resistor circuit 20 of the second operational amplifier 12 by one step to reduce the gain. Therefore, the control signal voltage shifts to an R point at a time. In a gain state at the R point, a gain is sufficiently small compared with that at a target K point. Therefore, the discrete-variable-gain amplifying unit (the first and the second operational amplifiers 11 and 12) operates to increase the gain. The control signal voltage rises in the left direction on a curve of step j-1. When the control signal voltage continues to rise and reaches an S point, the control signal voltage exceeds the threshold Vth-h. Consequently, the up/down counter 17 operates when the clock signal CLK with the period T2 is inputted, controls to switch a resistance of the load resistor circuit 20 of the second operational amplifier 12 by one step to increase the gain, and causes the gain to transition to the jth step (step j) immediately above the j-th step. The control signal voltage reaches a T point. A gain at the T point is larger than that at the target K point. Thus, the control signal voltage shifts in a direction of the Q point and reaches the Q point. After this, a routine same as that described above is repeated. Thus, it is difficult for the control signal voltage to reach a stable point. This is because the condition set in the beginning is not satisfactory. Taking this point into account, a condition of the gain control circuit obtained by merging the linear-variable-gain amplifying unit and the discrete-variable-gain amplifying unit is represented as follows.

$$2 \cdot \Delta Ga \geq Gd$$

In this equation, 2·ΔGa is a width of a linear variable gain and Gd is an amount of change per one step that changes stepwise. When the equation is not satisfied, a state in which a gain control loop is not stabilized is caused as explained above.

The signal amplifier according to this embodiment has a function of outputting a signal (a stop signal) for stopping a counter operation of the up/down counter 17 when the control signal voltage is between the upper limit and the lower limit thresholds Vth-h and Vth-l to stop the up/down counter 17. In other words, when the up/down counter 17 is operating, the second operational amplifier 12 of the discrete-variable-gain amplifying unit is performing an operation for switching the gain stepwise (discretely). When the up/down counter 17 is stopped, only the linear-variable-gain amplifying unit (the third operational amplifier 13) is operating. In this way, it is possible to prevent a wasteful consumption current from being fed and prevent unnecessary radiation as much as possible by controlling operation times of the discrete-variable-gain amplifying unit and the linear-variable-gain amplifying unit using a counter.

Moreover, the signal amplifier according to this embodiment has the two kinds of amplifiers, namely, the discrete-variable-gain amplifying unit and the linear-variable-gain amplifying unit. The discrete-variable-gain amplifying unit and the linear-variable-gain amplifying unit operate with predetermined time constants (T2 and T1 described above), respectively. It is preferable that the linear variable-gain amplifying unit is the third operational amplifier 13 having the time constant T1, a main part of the amplifying unit that changes a gain discretely is the second operational amplifier 12 having the time constant T2, and the time constants T1 and T2 have a relation of T1<<T2.

According to the embodiment explained above, since a linear gain variable width may be narrow, a bias state of an operation element does not change by a great degree when a gain is increased and when a gain is reduced. Thus, it is possible to perform gain control while satisfactorily keeping distortion and an NF. Since stepwise (discrete) gain change and linear gain change are combined, it is possible to easily secure a wide gain variable range compared with that in the past. It is possible to provide a circuit that is advantageous when an element robust against a switch operation and susceptible to a linear operation such as a MOS transistor is used in a gain control circuit. Since the counter stops an operation when necessary, it is possible to prevent wasteful power consumption. Since stepwise gain change and linear gain change are combined, it is possible to realize a large gain variable width compared with the analog gain change control circuit in the past. In particular, it is possible to realize a large change width with low power consumption. Moreover, since stepwise gain change and linear gain change are combined, the number of steps of a gain that changes stepwise or the number of bits for controlling the gain may be small.

Second Embodiment

A second embodiment of the invention will be explained with reference to FIG. 7. In a signal amplifier shown in FIG. 7, a positional relation between the discrete-variable-gain amplifying unit (the first and the second operational amplifiers 11 and 12) and the linear-variable-gain amplifying unit (the third operational amplifier 13) is opposite to that in the signal amplifier according to the first embodiment shown in FIG. 1.

Figure 7:
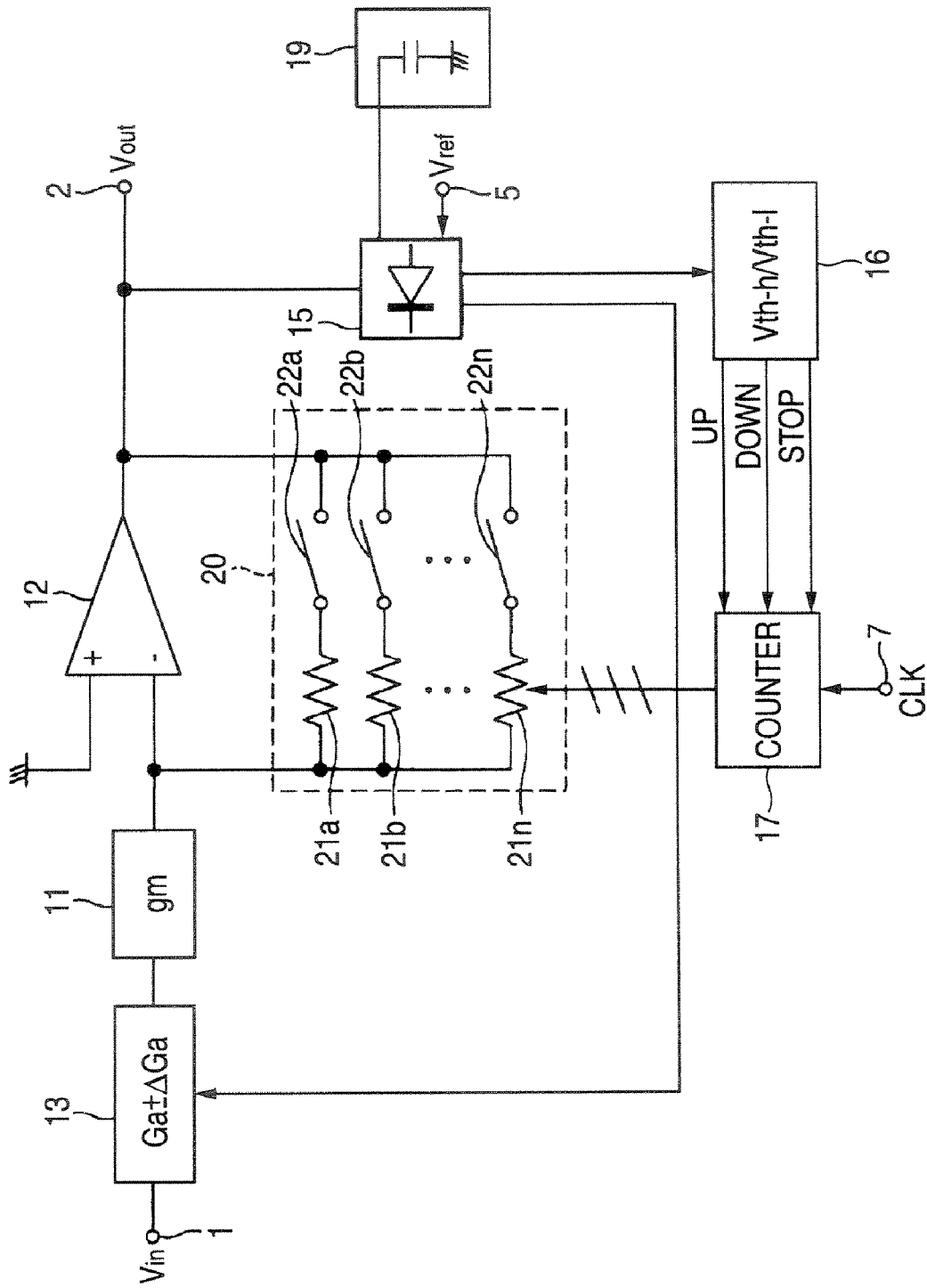
FIG. 7 is a circuit diagram showing an example of a structure of a signal amplifier according to a second embodiment of the invention.
Figure 8:
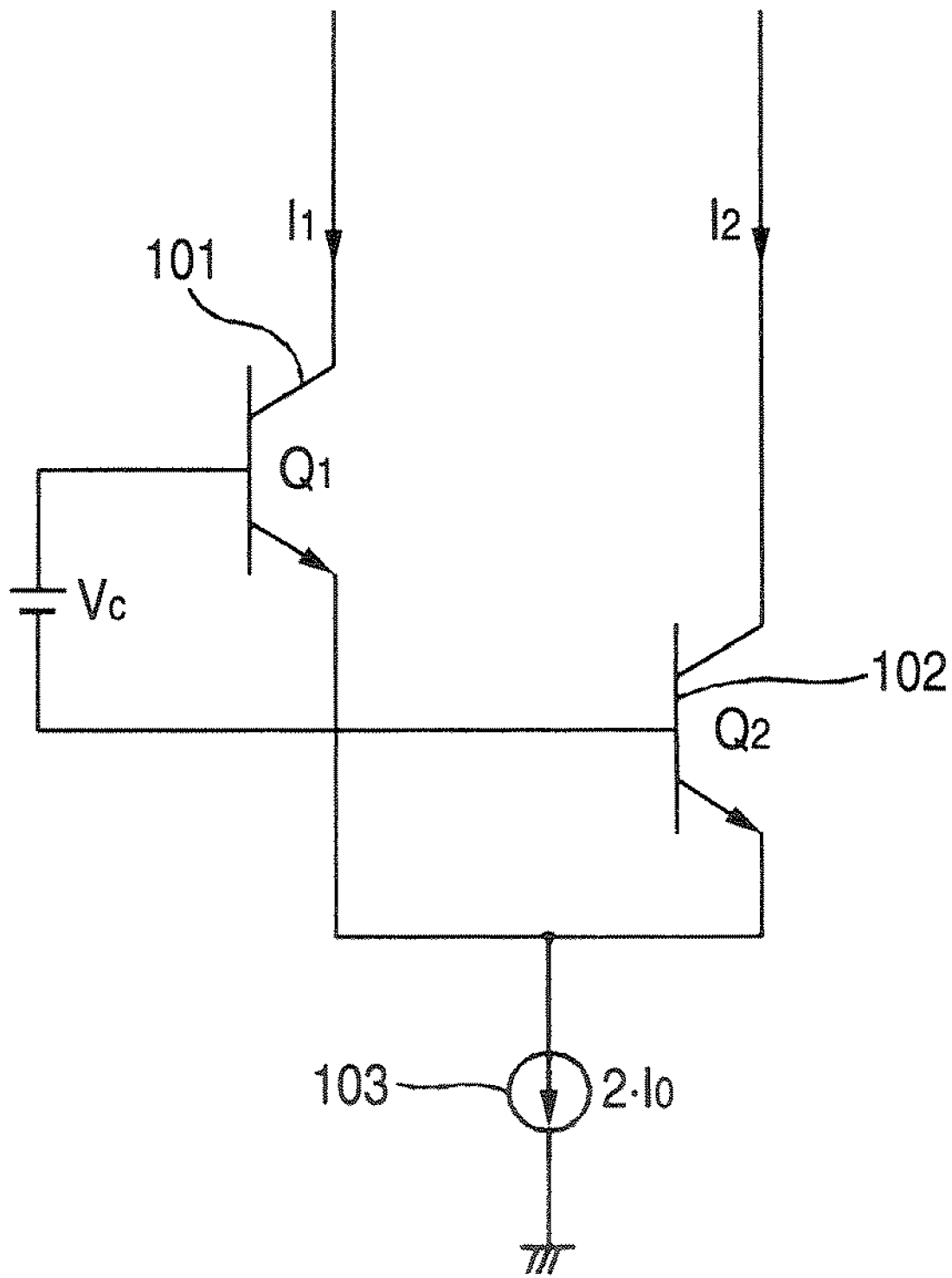
FIG. 8 is a circuit diagram showing an example of a variable-gain amplifier circuit that converts an input signal into a signal current and increases or decreases the signal current.
Figure 9A:
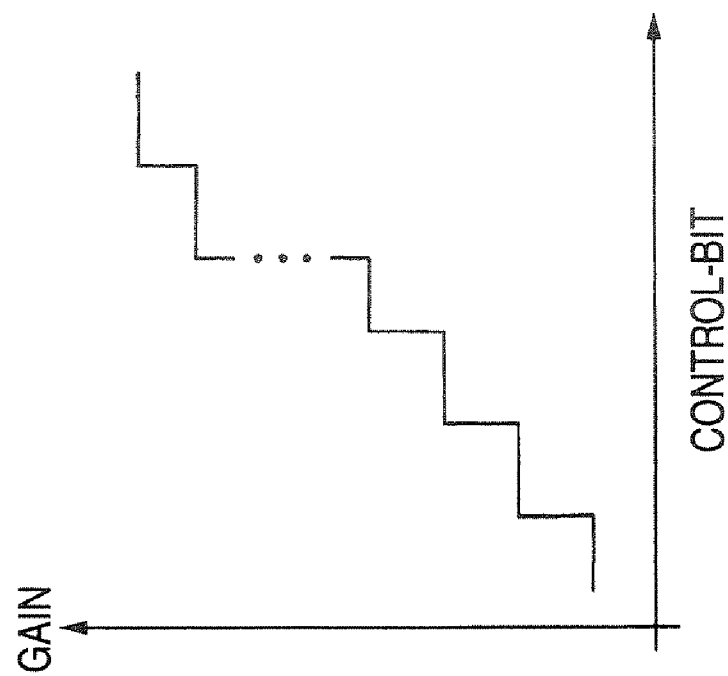
FIG. 9A is a circuit diagram showing an example of a variable-gain amplifier circuit that changes a load resistance for determining an amplification degree of an output signal and changes an output level.
Figure 9B:
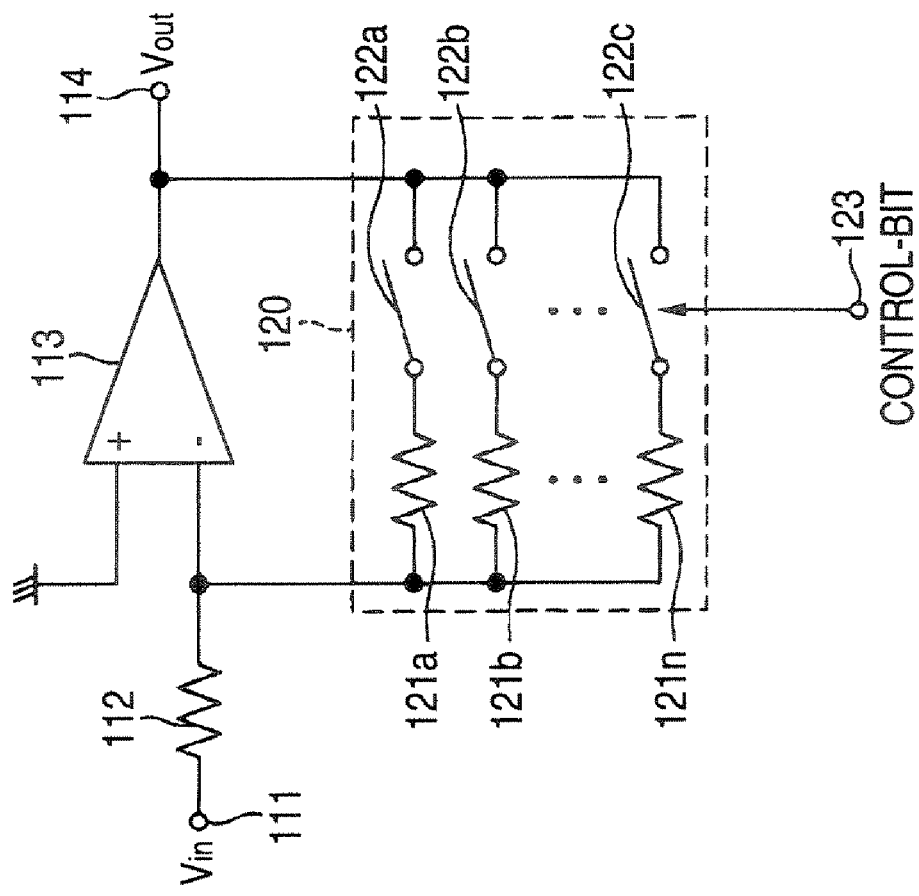
FIG. 9B is a diagram showing a change in a bit with respect to a control signal voltage.

In FIG. 7, an input signal (Vin) from the input terminal 1 is sent to the third operational amplifier 13 equivalent to the linear-variable-gain amplifying unit and an output from the third operational amplifier 13 is sent to an inverting input terminal (−terminal) of the second operational amplifier 12 via the first operational amplifier 11 having voltage-current conversion ability of gm [A/V]. The first and the second operational amplifiers 11 and 12 are equivalent to the discrete-variable-gain amplifying unit. A noninverting input terminal (+terminal) of the second operational amplifier 12 is connected to a reference potential, for example, a ground potential. The load resistor circuit 20 equivalent to a current-voltage converting unit is connected between the inverting input terminal (−terminal) and an output terminal of the second operational amplifier 12. A value (a load resistance Rd) of the load resistor circuit 20 changes stepwise (discretely or digitally). In the load resistor circuit 20, a series connection circuit of the resistor 21a and the switch 22a, a series connection circuit of the resistor 21b and the switch 22b, . . . , a series connection circuit of the resistor 21n and the switch 22n are connected in parallel to one another. An output signal (Vout) is extracted from the second operational amplifier 12 via the output terminal 2.

When the output signal (Vout) from the output terminal 2 is sent to a level detector 15, a control signal corresponding to an output level (a peak value of the output signal) is extracted and sent to a gain control terminal of the third operational amplifier 13 and also sent to the control-signal-voltage discriminator 16. A signal for counting up (up) and counting down (down) the up/down counter 17 and a stop signal for stopping a count operation are outputted from the control-signal-voltage discriminator 16. The signals are sent to the up/down counter 17. An output from the up/down counter 17 is sent to the load resistor circuit 20 of the second operational amplifier 12 as switch control signals.

The time constant circuit 19 is connected to the level detector 15. A control signal changes with the time constant T1 with respect to a change in the peak value of the output signal. The clock signal CLK for determining speed of the count operation is supplied to the up/down counter 17 via the clock input terminal 7.

Other components and operations of the signal amplifier according to the second embodiment shown in FIG. 7 are the same as those of the signal amplifier according to the first embodiment shown in FIG. 1. Thus, explanations of the components and the operations are omitted. In the signal amplifier according to the second embodiment, a condition between the time constants T1 and T2 (T1<<T2), a condition between a width of a linear variable gain $2 \cdot \Delta Ga$ and an amount of gain change per one step of a discrete variable gain ($2 \cdot \Delta Ga \geqq Gd$), and the like are also the same as those in the first embodiment. A total gain (a ratio of the output Vout to the input Vin) of the signal amplifier according to the second embodiment is as indicated by Equation 2. In other words, in a circuit configuration that satisfies Equation 2, it is possible to arbitrarily change an arrangement relation between the discrete-variable-gain amplifying unit and the linear-variable-gain amplifying unit. It goes without saying that the signal amplifier according to the second embodiment can realize effects same as those in the first embodiment. In constituting such a signal amplifier, attention should be paid to dynamic ranges of input and output. Since the linear-variable-gain amplifying unit manages an increase or decrease of signals analogically, it should be noted that deterioration in an NF is prevented more as the linear-variable-gain amplifying unit is set in a later stage of the amplifier.

The invention is not limited to the embodiments described above. For example, in the embodiments, the discrete-variable-gain amplifying unit (the first and the second operational amplifiers 11 and 12) controls to switch a resistance of the load resistor unit, which is used in the current-voltage converting unit of the second operational amplifier 12, stepwise. However, the discrete-variable-gain amplifying unit may control to switch a resistance (voltage-current conversion ability gm) of the first operational amplifier 11, which voltage-current converts an input voltage, stepwise or control to switch both the resistances. Besides, it goes without saying that various modifications are possible without departing from the spirit of the invention.

It should be understood by those skilled in the art that various modifications, combinations, sub-combinations, and alterations may occur depending on design requirements and other factors insofar as they are within the scope of the appended claims or the equivalents thereof.

What is claimed is:

1. A signal amplifier comprising:
a discrete-variable-gain amplifying unit, a gain of which takes a discrete value and changes stepwise;
a linear-variable-gain amplifying unit connected in series to the discrete-variable-gain amplifying unit, a gain of which changes continuously;
control-signal outputting means for detecting a level of an output signal from a series connection circuit of the discrete-variable-gain amplifying unit and the linear-variable-gain amplifying unit and outputting a control signal corresponding to a difference between the level of the output signal and a reference voltage set as a comparative level to control the gain of the linear-variable-gain amplifying unit; and
gain-switching control means for controlling to switch the gain of the discrete-variable-gain amplifying unit when the control signal deviates from a setting range for the control signal that is set according to a variable gain range of the discrete-variable-gain amplifying unit.

2. A signal amplifier according to claim 1, wherein the discrete-variable-gain amplifying unit includes:
a first operational amplifier circuit that converts an input signal voltage into an electric current; and
a second operational amplifier circuit that converts the electric current from the first operational amplifier into a voltage and has a load resistor unit, a resistance of which changes stepwise.

3. A signal amplifier according to claim 1, wherein, in the series connection circuit, the discrete-variable-gain amplifying unit is arranged on an input side thereof and the linear-variable-gain amplifying unit is arranged on an output side thereof.

4. A signal amplifier according to claim 1, wherein, in the series connection circuit, the linear-variable-gain amplifying unit is arranged on an input side thereof and the discrete-variable-gain amplifying unit is arranged on an output side thereof.

5. A signal amplifier according to claim 1, wherein
the control-signal outputting means outputs a control signal for performing control for reducing the gain of the linear-variable-gain amplifying unit when a peak value of an output signal from the series connection circuit is higher than the reference voltage and increasing the gain of the linear-variable-gain amplifying unit when a peak value of an output signal of the series connection circuit is lower than the reference voltage, and
the gain-switching control means controls to switch the gain of the discrete-variable-gain amplifying unit to increase by one step when a control signal voltage is larger than a first threshold Vth-h, controls to switch the gain of the discrete-variable-gain amplifying unit to decrease by one step when the control signal voltage is smaller than a second threshold Vth-l, and stops gain switching for the discrete-variable-gain amplifying unit when the control signal voltage is between the first threshold Vth-h and the second threshold Vth-l.

6. A signal amplifier according to claim 5, wherein an amount of change Gd for one step of the gain of the discrete-variable-gain amplifying unit is equal to or larger than a change width $2 \cdot \Delta Ga$ of the gain of the linear-variable-gain amplifying unit ($Gd \leqq 2 \cdot \Delta Ga$).

7. A signal amplifier according to claim 1, wherein a time constant T2 of switching control by the gain-switching control means is sufficiently large with respect to a time constant T1 of a change in the control signal ($T1 << T2$).

8. A signal amplifier comprising:
a discrete-variable-gain amplifying unit, a gain of which takes a discrete value and changes stepwise;
a linear-variable-gain amplifying unit connected in series to the discrete-variable-gain amplifying unit, a gain of which changes continuously;
a control-signal outputting unit configured to detect a level of an output signal from a series connection circuit of the discrete-variable-gain amplifying unit and the linear-variable-gain amplifying unit and output a control signal corresponding to a difference between the level of the output signal and a reference voltage set as a comparative level to control the gain of the linear-variable-gain amplifying unit; and
a gain-switching control unit configured to control to switch the gain of the discrete-variable-gain amplifying unit when the control signal deviates from a setting range for the control signal that is set according to a variable gain range of the discrete-variable-gain amplifying unit.

* * * * *